United States Patent
Yu et al.

(10) Patent No.: US 9,768,409 B2
(45) Date of Patent: Sep. 19, 2017

(54) ELECTROLUMINESCENT DEVICE AND DISPLAY DEVICE

(71) Applicant: BOE TECHNOLOGY GROUP CO., LTD., Bejing (CN)

(72) Inventors: Donghui Yu, Beijing (CN); Chun Jan Wang, Beijing (CN); Chengyuan Luo, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 14/762,048

(22) PCT Filed: Dec. 4, 2014

(86) PCT No.: PCT/CN2014/093010
§ 371 (c)(1),
(2) Date: Jul. 20, 2015

(87) PCT Pub. No.: WO2016/015424
PCT Pub. Date: Feb. 4, 2016

(65) Prior Publication Data
US 2016/0254484 A1    Sep. 1, 2016

(30) Foreign Application Priority Data

Jul. 31, 2014 (CN) .................... 2014 2 0429775 U

(51) Int. Cl.
*H01L 51/52* (2006.01)
(52) U.S. Cl.
CPC ................................ *H01L 51/5246* (2013.01)
(58) Field of Classification Search
CPC ............... H01L 51/524; H01L 51/5246; H01L 51/5259; H01L 27/14618; H01L 25/167;
(Continued)

(56) References Cited

U.S. PATENT DOCUMENTS 5,225,926 A * 7/1993 Cuomo .................. C23C 16/01
359/350
8,789,984 B2   7/2014 Lee et al.
(Continued)

FOREIGN PATENT DOCUMENTS

CN   102456845 A   5/2012
CN   103325957 A   9/2013
(Continued)

OTHER PUBLICATIONS

International Search Report of PCT/CN2014/093010 in Chinese, mailed Apr. 21, 2015 with English translation.
(Continued)

*Primary Examiner* — Caridad Everhart
(74) *Attorney, Agent, or Firm* — Collard & Roe, P.C.

(57) ABSTRACT

An electroluminescent device and a display device are provided. The electroluminescent device includes: a base substrate (100), a first surface of which is provided with a luminous element (110); a first substrate (210) having a first groove arranged to be opposed to the first surface of the base substrate (100); a sealing element (300) hermetically secured with a wall of the first groove, protruding from a notch of the first groove, and having a sealing groove provided to be opposed to a first surface of the base substrate (100); a part of the sealing element (300) protruding from the notch of the first groove is hermetically secured with the base substrate (100), and the luminous element (110) is arranged within the sealing groove. The electroluminescent device and display device depress the probability of the moisture in the air entering the sealing element and contacting with the luminous element, thus improving the performance and life of the electroluminescent device.

17 Claims, 2 Drawing Sheets

(58) Field of Classification Search
CPC .............. H01L 27/3276; H01L 27/3247; H01L 27/3281
See application file for complete search history.

(56) References Cited

U.S. PATENT DOCUMENTS

| | | | | |
|---|---|---|---|---|
| 2005/0116636 A1* | 6/2005 | Kang | .................... | H01L 51/524 313/512 |
| 2005/0285520 A1* | 12/2005 | Cok | .................... | H01L 51/529 313/512 |
| 2006/0141204 A1* | 6/2006 | Rogler | .................... | H01L 23/26 428/69 |
| 2008/0006819 A1* | 1/2008 | McCormick | ........ | H01L 51/5256 257/40 |
| 2008/0286541 A1* | 11/2008 | Zeisler | .................... | C04B 35/52 428/213 |
| 2011/0156084 A1 | 6/2011 | Choi et al. | | |
| 2013/0249384 A1 | 9/2013 | Sawabe et al. | | |
| 2014/0246665 A1 | 9/2014 | Lang et al. | | |

FOREIGN PATENT DOCUMENTS

| | | |
|---|---|---|
| CN | 103490016 A | 1/2014 |
| CN | 103875090 A | 6/2014 |
| CN | 203983341 U | 12/2014 |
| WO | 2013/011741 A1 | 1/2013 |

OTHER PUBLICATIONS

Notice of Transmittal of the International Search Report of PCT/CN2014/093010 in Chinese, mailed Apr. 21, 2015.
Written Opinion of the International Searching Authority of PCT/CN2014/093010 in Chinese, mailed Apr. 21, 2015 with English translation.

\* cited by examiner

ELECTROLUMINESCENT DEVICE AND DISPLAY DEVICE

CROSS REFERENCE TO RELATED APPLICATIONS

This application is the National Stage of PCT/CN2014/093010 filed on Dec. 4, 2014, which claims priority under 35 U.S.C. §119 of Chinese Application No. 201420429775.6 filed on Jul. 31, 2014, the disclosure of which is incorporated by reference.

TECHNICAL FIELD

The embodiments of the invention relate to an electroluminescent device and a display device.

BACKGROUND

The electroluminescent device has beneficial properties, such as active luminescence, wider visual angle, higher contrast, high response speed and so on, and is praised as a new generation of display techniques. According to the materials employed for the luminescent layer, the electroluminescent device is classified as inorganic electroluminescent device and organic electroluminescent device. When the luminescent layer contacting with the moisture in the air, the performance and life of the luminescent layer within the electroluminescent device would be deteriorated, thus it is required to isolate the luminescent layer from the moisture in the air. FIG. 1 illustrates an organic electroluminescent device 1 comprising a base substrate 2, the base substrate 2 is provided thereon with an anode electrode 3, a cathode electrode 5 and a luminescent layer 4 located between the anode electrode 3 and cathode electrode 5, as well as a sealing element 6 for sealing the base substrate 2 onto which the sealing element 6 is attached with an adhesives 7, and a first substrate 8 used for packaging. The sealing element 6 may be a cover glass, or an insulating board or an insulating film. The entire side surface 61 of the sealing element 6 contacts with air, thus due to resultant larger contact area, the moisture in the air at the side surface of the sealing element may pass through the adhesives and into the sealing element 6, contact with the luminescent layer, which deteriorates the performance and life of the luminescent layer in the electroluminescent device.

SUMMARY

At least one embodiment of the present invention provides an electroluminescent device and a display device, which allows for avoiding the undesired situation that, due to the large contact area between the air and the sealing element, the moisture in the air would have a higher probability of running into the sealing element and contacting with the luminous elements, thus deteriorating the performance and life of the electroluminescent device in a comparatively faster way.

At least one embodiment of the present invention provides an electroluminescent device comprising: a base substrate, a first surface of which is provided with a luminous element; a first substrate having a first groove arranged to be opposed to the first surface of the base substrate; a sealing element hermetically secured with a wall of the first groove, protruding from a notch of the first groove, and having a sealing groove provided to be opposed to the first surface of the base substrate; a part of the sealing element protruding from the notch of the first groove is hermetically secured with the base substrate, and the luminous element is arranged within the sealing groove.

For example, the sealing element covers and is hermetically secured with a bottom surface of the first groove.

For example, a first surface of the sealing element is hermetically secured with the first surface of the base substrate, wherein the first surface of the sealing element is a surface where the part of the sealing element protruding from the notch of the first groove is opposed to the first surface of the base substrate.

For example, the sealing element is formed of a sealant material.

For example, the sealing element is a sealing element formed of epoxy resin, polyurethane, phenolic resin, unsaturated polyester or melamine resin materials.

For example, the sealing element is of an one-piece configuration.

For example, the sealing element comprises a sealing bottom plate covering the bottom of the first groove and sealing side plates enclosing around the bottom plate, the sealing bottom plate and the sealing side plates enclose to form the sealing groove.

For example, a blocking layer is formed between the luminous element and the sealing elements. For example, the blocking layer is formed of an organic film or an inorganic film.

At least one embodiment of the present invention provides an electroluminescent device comprising: a base substrate, a first surface of which is provided with a luminous element; a second substrate having a second groove arranged to be opposed to the first surface of the base substrate; the second substrate is hermetically secured with the base substrate, and the luminous element is provided within the second groove.

For example, a first surface of the second substrate is hermetically secured with a first surface of the base substrate, wherein the first surface of the second substrate is a surface of the second substrate facing the first surface of the base substrate.

At least one embodiment of the present invention provides a display device comprising any one of the above electroluminescent devices.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1:
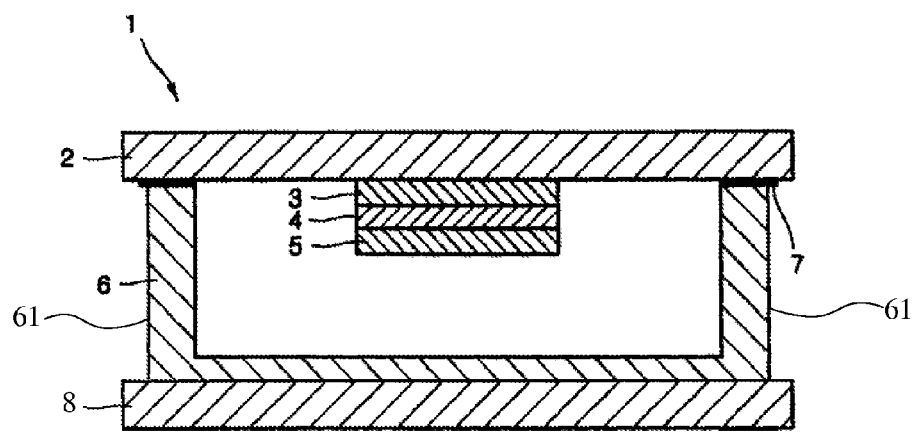
FIG. 1 is a schematic view of an organic electroluminescent device.

REFERENCE NUMERALS OF THE MAIN COMPONENTS 1 organic electroluminescent device, 2 base substrate, 3 anode electrode, 4 luminescent layer, 5 cathode electrode, 6 sealing element, 61 entire side surface of the sealing element, 7 adhesives, 8 first substrate, 100 base substrate, 110 luminous element, 210 first substrate, 215 first groove, 220 second substrate, 225 second groove, 300 sealing element, 310 side surface of the sealing element, 320 bottom surface of the sealing element.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 2:
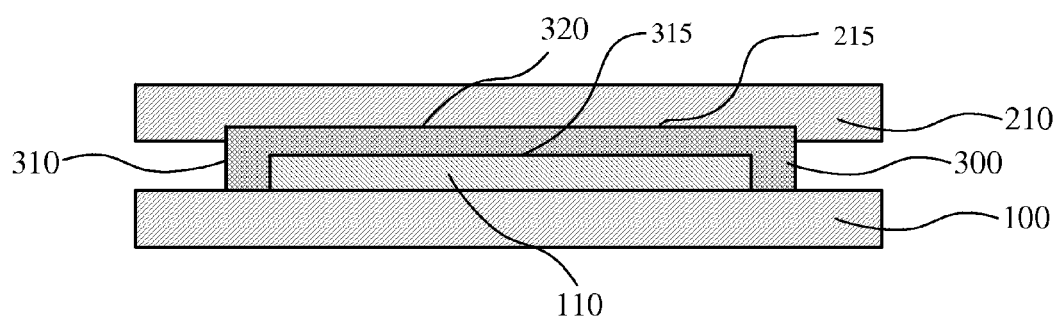
FIG. 2 is a schematic view of an electroluminescent device according to an embodiment of the present invention.
Figure 3:
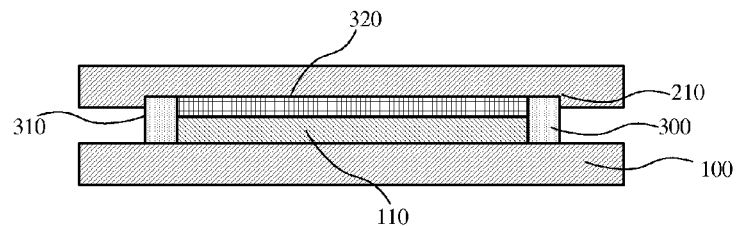
FIG. 3 is a schematic view of an electroluminescent device according to an embodiment of the present invention.

The electroluminescent device according to at least one embodiment of the present invention, as illustrated in FIGS. 2 and 3, comprises a base substrate 100, an luminous element 110, a first substrate 210 and a sealing element 300.

The first surface of the base substrate 100 is provided with an luminous element 110; the first substrate 210 has a first groove 215 arranged to be opposed to the first surface of the base substrate 100; the sealing element 300 is hermetically secured with the wall of the first groove 215, protruding from the notch of the first groove, and has a sealing groove 315 provided to be opposed to the first surface of the base substrate 100; a part of the sealing element 300 protrudes from the notch of the first groove 215 is hermetically secured with the base substrate, and the luminous element 110 is arranged within the sealing groove 315.

In the electroluminescent device according to at least one embodiment of the present invention, the first substrate 210 has a first groove 215, the sealing element 300 is hermetically secured with the wall of the first groove 215 and protrudes from the notch of the first groove 215. For convenience of description, the surface, where the part of the sealing element 300 being hermetically secured with the wall of the first groove 215 is located, is taken as the side surface 310 of the sealing element, that is to say, when the side surface 310 of the sealing element is hermetically secured with the wall of the first groove 215, a part of the side surface 310 of the sealing element is hermetically secured with the wall of the first groove 215; the part of the sealing element 300 protruding from the notch of the first groove 215 is hermetically secured with the base substrate 100, and the luminous element 110 is arranged within the sealing groove 315, that is to say, the luminous element 110 is sealed into the sealing groove 315 of the sealing element 300. In this way, a part of the side surface 310 of the sealing element 300 is hermetically secured with the wall of the first groove 215, thus can not touch the air; another part of the side surface 310 of the sealing element 300 contacts with air, that is, only a part of the side surface of the sealing element 300 could contact with air, thus decreasing contact area between the side surface of the sealing element 300 and the air, depressing probability of the moisture of air entering into the sealing element 300 and contacting with the luminous element 110, which improves the performance and life of the electroluminescent device.

Further, as illustrated in FIGS. 2 and 3, the sealing element 300 could cover the bottom surface of the first groove 215 and be hermetically secured therewith. For convenience of description, the surface of the sealing element 300 covering the bottom surface of the first groove 215 is taken as the bottom surface 320 of the sealing element. In this way, the bottom surface 320 of the sealing element 300 does not contact with the air, depressing the probability of the moisture in the air running through the bottom surface of the sealing element 300 into the sealing element 300 and contacting the luminous element 110, thus improving the performance and life of the electroluminescent device.

For example, the part of the aforesaid sealing element 300 protruding from the notch of the first groove 215 may be hermetically secured with the base substrate 100 in a way as illustrated in FIGS. 2 and 3, in which the first surface of the sealing element 300 is hermetically secured with the first surface of the base substrate 100; and the first surface of the sealing element 300 is the surface of the part of the sealing element 300 protruding from the notch of the first groove 215 facing the first surface of the base substrate 100.

For example, the sealing element formed of sealant materials may be selected, and for example, the sealing element is formed of epoxy resin, polyurethane, phenolic resin, unsaturated polyester or melamine resin materials etc. With the sealing element formed with sealant materials, a better sealing quality could be obtained, it is possible to depress the probability of the moisture in the air entering the sealing element and contacting with the luminous element, thus improving the performance and life of the electroluminescent device.

The aforesaid sealing element could be the sealing element of one-piece configuration as illustrated in FIG. 2, and also could be the sealing element of a divided structure as illustrated in FIG. 3. As illustrated in FIG. 3, the sealing element 300 of the divided structure comprises a sealing bottom plate 320 covering the bottom of the first groove 215 and sealing side plates 310 enclosing around the bottom plate 320, the sealing bottom plate 320 and the sealing side plates 310 enclose to form the sealing groove 315. It is possible to chose the sealing element of one-piece configuration or sealing element of the divided structure according to the difficulty extent of actual technology, cost and other factors.

Figure 4:
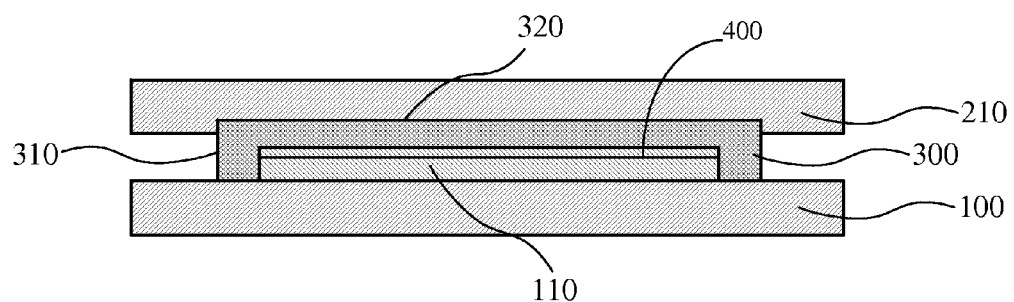
FIG. 4 is a schematic view of an electroluminescent device according to an embodiment of the present invention.

Further, in another embodiment, as illustrated in FIG. 4, it is also possible to form a blocking layer 400 between the luminous element 110 and the sealing element 300, such a blocking layer 400 could be a blocking layer formed of organic film or inorganic film. With the blocking layer 400 between the luminous element 110 and the sealing element 300, it is possible to further depress the probability of the moisture in the air running through the sealing element 300 and the blocking layer 400 and contacting the luminous element 110, thus improving the performance and life of the electroluminescent device.

According to the luminescent materials employed, the aforesaid luminous element may be an organic electroluminescent element or an inorganic electroluminescent element.

An electroluminescent device according to another embodiment of the present invention, as illustrated in FIG. 4, comprises a base substrate 100, a luminous element 110, and a second substrate 220.

The first surface of the base substrate 100 is provided with the luminous element 110; the second substrate 220 has a second groove 215 arranged to be opposed to the first surface of the base substrate 100; the second substrate 220 is hermetically secured with the base substrate 100, and the luminous element 110 is provided within the second groove 225.

In the electroluminescent device of this embodiment, the second substrate 220 comprises a second groove 225, and when the second substrate 220 is hermetically secured with the base substrate 100, the luminous element 110 is placed within the second groove 225 of the second substrate 220. The second substrate 220 is provided with the second groove 225, thereby the second substrate 220 is also taken as a sealing element used for packaging. The air could merely enter through the location where the second substrate 220 is hermetically secured with the base substrate 100, thus greatly depress the probability of the moisture in the air entering the second groove 225 and contacting with the luminous element 110, improving the performance and life of the electroluminescent device.

Figure 5:
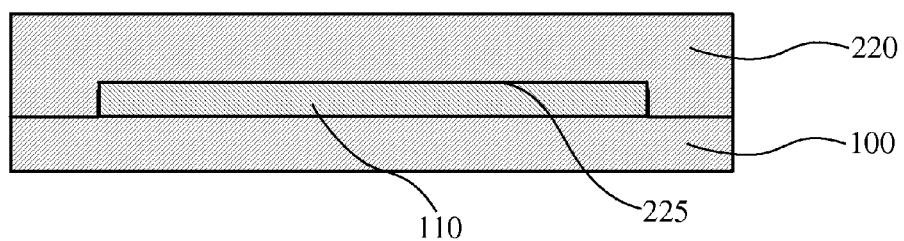
FIG. 5 is a schematic view of an electroluminescent device according to an embodiment of the present invention.

For example, regarding the way by which the second substrate 220 is hermetically secured with the base substrate 100, situation may be that the first surface of the second substrate 220 is hermetically secured with the first surface of the base substrate 110, as illustrated in FIG. 5, the first surface of the second substrate 220 is a surface of the second substrate 220 facing the first surface of the base substrate 100. As such, the first surface of the second substrate is hermetically secured with the first surface of the base substrate, while air could merely enter through the location where the first surface of the second substrate is hermetically secured with the first surface of the base substrate, thus greatly depressing the probability of the moisture in the air entering the second groove and contacting with the luminous element, improving the performance and life of the electroluminescent device.

At least one embodiment of the present invention provides a display device comprising any one of the above electroluminescent devices.

The electroluminescent device and display device provided by at least one embodiment of the present invention could depress the probability of the moisture in the air entering the sealing element and contacting with the luminous element by decreasing the contact area of the side surface of the sealing element with the air or by the fact that the air could merely enter through the location where the second substrate is hermetically secured with the base substrate, thus improve the performance and life of the electroluminescent device.

The foregoing embodiments are merely exemplary embodiments of the invention, and not intended to define the scope of the invention, and the scope of the invention is determined by the appended claims.

The present application claims the priority of the Chinese patent application No. 201420429775.6 filed on Jul. 31, 2014, the entirety of which is incorporated herein by reference as a part of the present application.

What is claimed is:

1. An electroluminescent device, comprising:
a base substrate, a first surface of which is provided with a luminous element;
a first substrate having a first groove arranged to be opposed to the first surface of the base substrate;
a sealing element hermetically secured with a wall of the first groove, protruding from a notch of the first groove, and having a sealing groove provided to be opposed to the first surface of the base substrate;
a part of the sealing element protruding from the notch of the first groove is hermetically secured with the base substrate, and the luminous element is arranged within the sealing groove,
wherein a part of a side surface of the sealing element is exposed between the first substrate and the base substrate, and
wherein both a side surface of the luminous element and a surface of the luminous element opposite to the base substrate are completely covered by the sealing element.

2. The electroluminescent device according to claim 1, wherein, the sealing element covers and is hermetically secured with a bottom surface of the first groove.

3. The electroluminescent device according to claim 2, wherein, the sealing element comprises a sealing bottom plate covering the bottom of the first groove and sealing side plates enclosing around the bottom plate, the sealing bottom plate and the sealing side plates enclose to form the sealing groove.

4. The electroluminescent device according to claim 2, wherein, a first surface of the sealing element is hermetically secured with the first surface of the base substrate, and is a surface where the part of the sealing element protruding from the notch of the first groove is opposed to the first surface of the base substrate.

5. The electroluminescent device according to claim 1, wherein, a first surface of the sealing element is hermetically secured with the first surface of the base substrate, and is a surface where the part of the sealing element protruding from the notch of the first groove is opposed to the first surface of the base substrate.

6. The electroluminescent device according to claim 5, wherein, the sealing element is of one-piece configuration.

7. The electroluminescent device according to claim 5, wherein, the sealing element is formed of a sealant material.

8. The electroluminescent device according to claim 7, wherein, the sealing element is formed of epoxy resin, polyurethane, phenolic resin, unsaturated polyester or melamine resin materials.

9. The electroluminescent device according to claim 5, wherein, a blocking layer is formed between the luminous element and the sealing elements.

10. The electroluminescent device according to claim 9, wherein, the blocking layer is the formed of an organic film or an inorganic film.

11. A display device comprising an electroluminescent device, the electroluminescent device comprising:
a base substrate, a first surface of which is provided with a luminous element;
a first substrate having a first groove arranged to be opposed to the first surface of the base substrate;
a sealing element hermetically secured with a wall of the first groove, protruding from a notch of the first groove, and having a sealing groove provided to be opposed to the first surface of the base substrate;
a part of the sealing element protruding from the notch of the first groove is hermetically secured with the base substrate, and the luminous element is arranged within the sealing groove,
wherein a part of a side surface of the sealing element is exposed between the first substrate and the base substrate, and
wherein both a side surface of the luminous element and a surface of the luminous element opposite to the base substrate are completely covered by the sealing element.

12. The display device according to claim 11, wherein, the sealing element covers and is hermetically secured with a bottom surface of the first groove.

13. The display device according to claim 12, wherein, the sealing element comprises a sealing bottom plate covering the bottom of the first groove and sealing side plates enclosing around the bottom plate, the sealing bottom plate and the sealing side plates enclose to form the sealing groove.

14. The display device according to claim 11, wherein, a first surface of the sealing element is hermetically secured with the first surface of the base substrate, and is a surface where the part of the sealing element protruding from the notch of the first groove is opposed to the first surface of the base substrate.

15. The display device according to claim 14, wherein, the sealing element is of one-piece configuration.

16. The display device according to claim 14, wherein, the sealing element is formed of a sealant material.

17. The display device according to claim 16, wherein, the sealing element is formed of epoxy resin, polyurethane, phenolic resin, unsaturated polyester or melamine resin materials.

* * * * *